(12) United States Patent
Yun et al.

(10) Patent No.: US 12,364,150 B2
(45) Date of Patent: Jul. 15, 2025

(54) DISPLAY APPARATUS WITH PENETRATING PORTION AND METHOD OF MANUFACTURING SAME

(71) Applicant: Samsung Display Co., Ltd., Yongin-si (KR)

(72) Inventors: Jonghyun Yun, Yongin-si (KR); Junyoung Kim, Yongin-si (KR); Seunggyu Tae, Yongin-si (KR); Jongmoo Huh, Yongin-si (KR); Kwangsoo Lee, Yongin-si (KR); Sangcheon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/637,063

(22) Filed: Apr. 16, 2024

(65) Prior Publication Data

US 2024/0268207 A1 Aug. 8, 2024

Related U.S. Application Data

(63) Continuation of application No. 18/302,176, filed on Apr. 18, 2023, now Pat. No. 11,997,912, which is a
(Continued)

(30) Foreign Application Priority Data

Dec. 27, 2016 (KR) .......................... 10-2016-0180419

(51) Int. Cl.
*H10K 59/88* (2023.01)
*H10K 50/844* (2023.01)
(Continued)

(52) U.S. Cl.
CPC ........... *H10K 59/88* (2023.02); *H10K 50/844* (2023.02); *H10K 59/122* (2023.02);
(Continued)

(58) Field of Classification Search
CPC ...................................................... H10K 59/88
(Continued)

(56) References Cited

U.S. PATENT DOCUMENTS 8,465,992 B2 6/2013 Kim et al.
2011/0052836 A1 3/2011 Kim et al.
(Continued)

FOREIGN PATENT DOCUMENTS

JP 2010-14475 1/2010
KR 10-2008-0076554 8/2008
(Continued)

*Primary Examiner* — Ajay Arora
(74) *Attorney, Agent, or Firm* — KILE PARK REED & HOUTTEMAN PLLC

(57) ABSTRACT

A display apparatus includes a flexible substrate, a thin-film transistor unit, and a light-emitting unit. The flexible substrate includes a display area has a first area, a peripheral area which is adjacent to the display area, and a first penetrating portion corresponding to the first area. The thin-film transistor unit is in the display area and at least a portion of the peripheral area. The thin-film transistor unit includes a thin-film transistor and an insulation layer and has a second penetrating portion at a location corresponding to the first penetrating portion. The light-emitting unit is on the thin-film transistor unit and includes a pixel electrode, an intermediate layer including an emission layer, and a counter electrode.

20 Claims, 10 Drawing Sheets

Related U.S. Application Data continuation of application No. 16/935,406, filed on Jul. 22, 2020, now Pat. No. 11,653,551, which is a continuation of application No. 15/855,373, filed on Dec. 27, 2017, now Pat. No. 10,727,450.

(51) Int. Cl.
| | | |
|---|---|---|
| *H10K 59/122* | (2023.01) | |
| *H10K 59/80* | (2023.01) | |
| *H10K 71/00* | (2023.01) | |
| *H10K 71/80* | (2023.01) | |
| *H10K 77/10* | (2023.01) | |
| *H10K 59/12* | (2023.01) | |
| *H10K 102/00* | (2023.01) | |

(52) U.S. Cl.
CPC ......... *H10K 59/8731* (2023.02); *H10K 71/00* (2023.02); *H10K 71/80* (2023.02); *H10K 77/111* (2023.02); *H10K 59/1201* (2023.02); *H10K 71/851* (2023.02); *H10K 2102/311* (2023.02)

(58) Field of Classification Search
USPC .............................................. 257/40
See application file for complete search history.

(56) References Cited

U.S. PATENT DOCUMENTS

| | | |
|---|---|---|
| 2014/0098005 A1 | 4/2014 | Kim et al. |
| 2016/0190389 A1 | 6/2016 | Lee et al. |
| 2016/0285038 A1* | 9/2016 | Kim ..................... H10K 50/84 |
| 2017/0148856 A1* | 5/2017 | Choi .................... H10K 50/844 |
| 2017/0237037 A1 | 8/2017 | Choi et al. |
| 2018/0151642 A1 | 5/2018 | Oh |
| 2018/0183015 A1 | 6/2018 | Yun et al. |

FOREIGN PATENT DOCUMENTS

| | | |
|---|---|---|
| KR | 10-2011-0023138 | 3/2011 |
| KR | 10-2012-0042151 | 5/2012 |
| KR | 10-2014-0045838 | 4/2014 |
| KR | 10-2016-0080310 | 7/2016 |
| KR | 10-2017-0095444 | 8/2017 |

\* cited by examiner

DISPLAY APPARATUS WITH PENETRATING PORTION AND METHOD OF MANUFACTURING SAME

CROSS-REFERENCE TO RELATED APPLICATION(S)

This is a continuation application of U.S. patent application Ser. No. 18/302,176, filed Apr. 18, 2023, the entire contents of which are incorporated herein by reference. U.S. patent application Ser. No. 18/302,176 is a continuation application of U.S. patent application Ser. No. 16/935,406, filed Jul. 22, 2020, now U.S. Pat. No. 11,653,551, issued May 16, 2023, the entire contents of which are incorporated herein by reference. U.S. patent application Ser. No. 16/935,406, is a continuation of U.S. patent application Ser. No. 15/855,373, filed on Dec. 27, 2017, now U.S. Pat. No. 10,727,450, issued Jul. 28, 2020, the entire contents of which are incorporated herein by reference. U.S. Pat. No. 10,727,450 claims priority to and benefits of Korean Patent Application No. 10-2016-0180419, filed on Dec. 27, 2016 in the Korean Intellectual Property Office, the entire contents of which are incorporated herein by reference for all purposes.

BACKGROUND

1. Field

One or more embodiments described herein relate to a display apparatus and a method for manufacturing a display apparatus.

2. Description of the Related Art

An organic light-emitting display is a self-emissive device that exhibits a wide viewing angle, excellent contrast, and fast response speed. As a result, these displays are suitable for use in mobile phones, televisions, and other electronic devices.

One type of organic light-emitting display includes a flexible substrate made of synthetic resin. The flexibility of the substrate may make it difficult to handle during manufacturing. In an attempt to solve this problem, the flexible substrate may be placed on rigid supporting substrate during manufacturing. The supporting substrate is then separated from the flexible substrate at a later time. In order to form some layers of the flexible substrate, a fine metal mask (FMM) may be used. However, it may not be easy to apply a new design to the display area of such a display because of the various layers.

SUMMARY

In accordance with one or more embodiments, a display apparatus includes a flexible substrate including a display area having a first area, a peripheral area adjacent to the display area, and a first penetrating portion corresponding to the first area; a thin-film transistor unit in the display area and at least a portion of the peripheral area, the thin-film transistor unit including a thin-film transistor and an insulation layer and having a second penetrating portion at a location corresponding to the first penetrating portion; and a light-emitting unit on the thin-film transistor unit and including a pixel electrode, an intermediate layer including an emission layer, and a counter electrode.

The first penetrating portion and the second penetrating portion may have a same inner surface. The display apparatus may include a first dam on the thin-film transistor unit and surrounding the second penetrating portion. The first dam may be spaced apart from the second penetrating portion by a predetermined distance. The insulation layer may include at least one inorganic insulation film, and an inorganic insulation film in the second area, which is defined by the predetermined distance, includes at least one fine hole.

The display apparatus may include a second dam on an edge of the thin-film transistor unit. The display apparatus may include an encapsulator on the counter electrode and including an organic encapsulation layer, wherein the organic encapsulation layer is between the first dam and the second dam. The display apparatus may include a pixel defining film that defines a pixel area by exposing a center portion of the pixel electrode and covering an edge of the pixel electrode, wherein the first dam and the second dam include a same material as the pixel defining film. At least a portion of the counter electrode may be on the first dam.

In accordance with one or more other embodiments, a method for manufacturing a display apparatus includes forming a flexible substrate including a peripheral area adjacent to a display area on a supporting substrate, the display area including a first area and a second area surrounding an outer area of the first area and being spaced apart from the first area by a predetermined distance; forming a thin-film transistor unit including a thin-film transistor and an insulation layer in the display area and at least a portion of the peripheral area of the flexible substrate; forming a first dam surrounding the second area; laser-cutting the thin-film transistor unit and the flexible substrate along the first area; forming a light-emitting unit including a pixel electrode, an intermediate layer including an emission layer, and a counter electrode on the thin-film transistor unit; and forming an encapsulator including an organic encapsulation layer on the counter electrode.

The method may include forming a pixel defining film on the thin-film transistor unit to expose a center portion of the pixel electrode and to surround an edge of the pixel electrode, wherein the forming of the first dam and the forming of the pixel defining film are performed simultaneously.

The laser-cutting may include forming a first penetrating portion in the flexible substrate; and forming a second penetrating portion in the thin-film transistor unit. The first penetrating portion and the second penetrating portion may have a same inner surface. The method may include forming a second dam on the thin-film transistor unit to surround an edge of the thin-film transistor unit. Forming the first dam and forming the second dam may be performed simultaneously. Forming the encapsulator may include forming the organic encapsulation layer between the first dam and second dam.

The method may include attaching a top film to the top of the encapsulator; separating the flexible substrate from the supporting substrate; attaching a bottom film to the flexible substrate separated from the supporting substrate; cell-cutting the bottom film and the flexible substrate; removing the bottom film and attaching a protective film to the flexible substrate; and removing the top film. The counter electrode may be integrally formed on the flexible substrate, and at least a portion of the counter electrode may be on the first dam.

Forming the encapsulator may include forming an inorganic encapsulation layer on the organic encapsulation layer, and at least a portion of the inorganic encapsulation layer may be formed on the counter electrode on the first dam. The insulation layer may include an inorganic insulation film, and at least one fine hole may be formed in the inorganic insulation film in the second area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
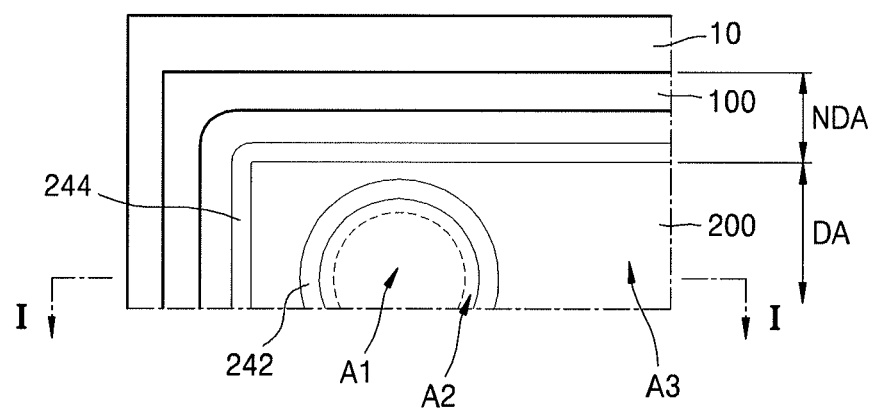
FIGS. 1A and 1B illustrate an operation in an embodiment of a process for manufacturing a display apparatus.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1B:
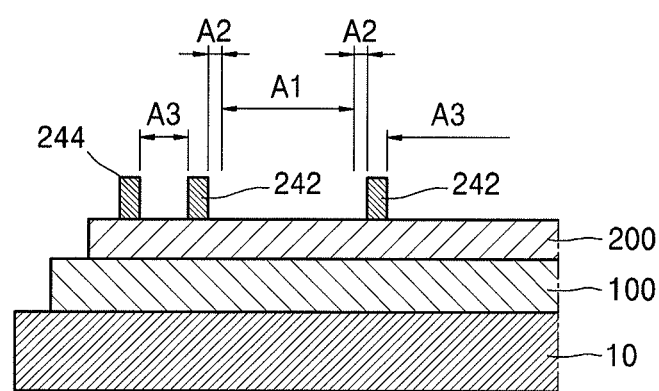

FIGS. 1A and 1B illustrate plan and cross-sectional views of an embodiment of a process for manufacturing a display apparatus.

Referring first to FIGS. 1A and 1B, the method includes disposing a flexible substrate 100 on a supporting substrate 10. Since the flexible substrate 100 has a flexible characteristic, it may not be easy for the flexible substrate 100 alone to sufficiently support various layers that are to be disposed on the flexible substrate 100. Therefore, after the flexible substrate 100 is disposed on the supporting substrate 10 (which is able to support the flexible substrate 100), various devices and layers may be disposed on the flexible substrate 100. The supporting substrate 10 may include, for example, metal or a glass material with a rigidity greater than the flexible substrate 100.

The flexible substrate 100 may include various materials. Examples include metal or plastic material, e.g., polyethylene terephthalate (PET), polyethylenenaphthalate (PEN), polyimide, etc. The flexible substrate 100 may include a non-display area NDA and a display area DA. The display area NDA displays an image and includes light-emitting devices. The non-display area DA does not display an image and may include, for example, one or more circuits or wires for driving display of an image in the display area DA.

A sacrificing layer may be between the supporting substrate 10 and the flexible substrate 100. The sacrificing layer may reduce or minimize damage to the flexible substrate 100, or various devices and layers on the flexible substrate 100, when the flexible substrate 100 is separated from the supporting substrate 10. The sacrificing layer may include various materials. For example, the sacrificing layer may include an inorganic material layer including silicon, an organic material layer including an organic material, or a metal layer including a metal.

A thin-film transistor unit 200 may be disposed on the flexible substrate 100. The thin-film transistor unit 200 may include a thin-film transistor 210 and insulation layers 220 and 230 (e.g., see FIG. 9). The thin-film transistor unit 200 may be disposed in at least portions of the display area DA and the non-display area NDA of the flexible substrate 100. The thin-film transistor unit 200 in the display area DA may include various devices, such as a thin-film transistor and a capacitor for supplying electricity to a light-emitting device. The thin-film transistor unit 200 in the non-display area NDA may include one or more circuits and wires for controlling display of an image in the display area DA. The thin-film transistor unit 200 may also include an insulation layer, which, for example, includes a plurality of organic encapsulation films 220 (e.g., see FIG. 9). The organic encapsulation film 220 may insulate electrodes from one another to constitute a thin-film transistor.

A first dam 242 may be on the thin-film transistor unit 200 to define a first area A1 in the display area DA of the flexible substrate 100 and a second area A2 outside the first area A1. The first area A1 may be an area inside the first dam 242, in which at least a portion of the flexible substrate 100 and at least a portion of the thin-film transistor unit 200 are removed by laser-cutting.

A second dam 244 may be on the thin-film transistor unit 200 and may surround the edges of the thin-film transistor unit 200. The second dam 244 may serve as a partitioning wall for preventing an organic encapsulation layer 420 of an encapsulator 400 (e.g., as described below) from flowing to outside of the flexible substrate 100.

The first dam 242 may also serve as a partitioning wall to prevent the organic encapsulation layer 420 of the encapsulator 400 from flowing into the first area A1. The first dam 242 and the second dam 244 may include a same material. For example, the first dam 242 and the second dam 244 may include a same material as the pixel defining film 240. The first dam 242, the second dam 244, and the pixel defining film 240 may be disposed, for example, in the same process.

A third area A3 may be between the first dam 242 and the second dam 244. The third area A3 may be a light-emitting unit which includes light emitting devices, e.g., organic light-emitting devices.

Figure 9:
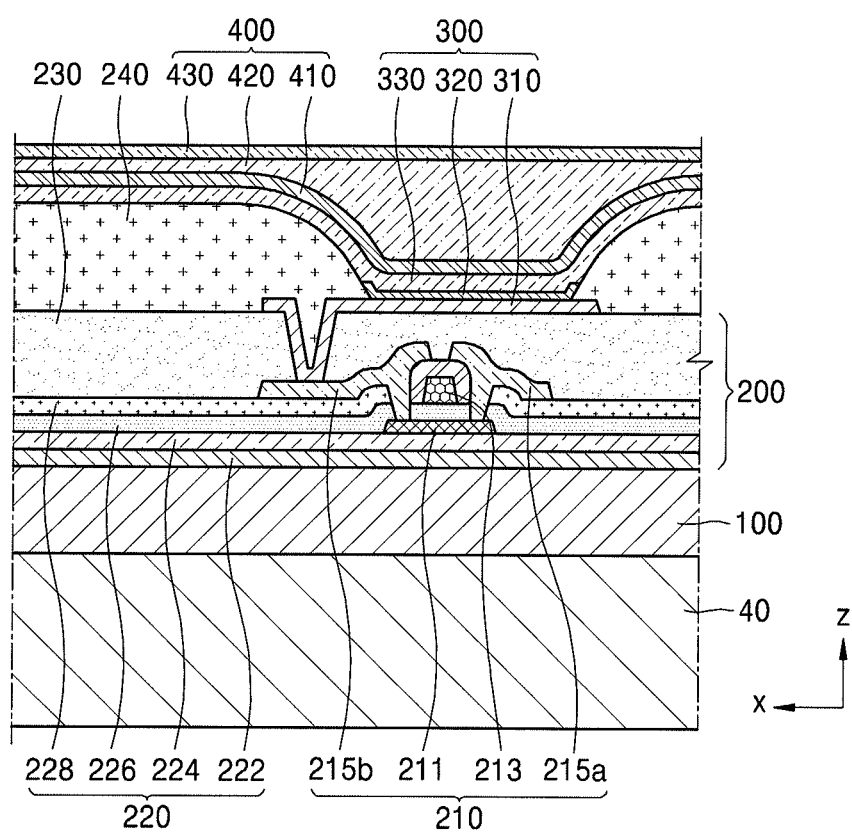
FIG. 9 illustrates an embodiment of a display area of a display apparatus.

Referring to FIG. 9, a pixel electrode 310 may be disposed on the thin-film transistor unit 200 before the first dam 242 and the second dam 244 are disposed. After the pixel electrode 310 is disposed, a pixel defining film may be disposed to cover the edges of the pixel electrode 310 and expose the center portion of the pixel electrode 310. Therefore, the first dam 242 and the second dam 244 may be disposed in the same process with the pixel defining film 240, and may be disposed on the thin-film transistor unit 200 after the pixel electrode 310 is first disposed.

Figure 2A:
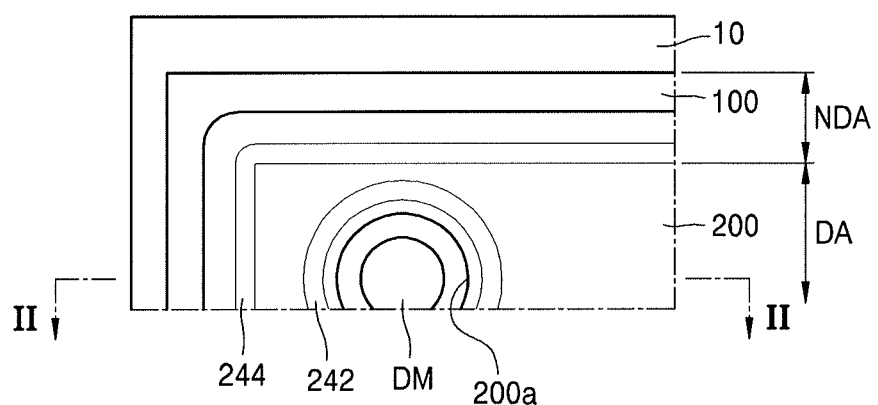
FIGS. 2A and 2B illustrate another operation in the embodiment of a process for manufacturing a display apparatus.
Figure 2B:
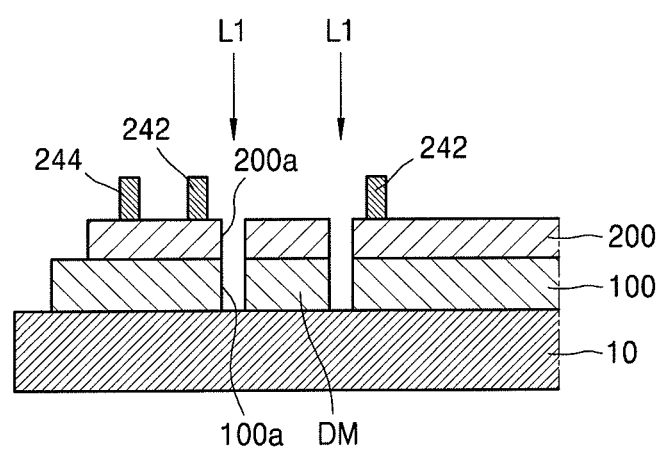

FIGS. 2A and 2B illustrate plan and cross-sectional views of an additional operation in the embodiment of a process for manufacturing a display apparatus.

Referring to FIGS. 2A and 2B, the additional operation may include a laser-cutting operation for the flexible substrate 100 and the thin-film transistor unit 200 on the supporting substrate 10. As described above, the flexible substrate 100 has the display area DA and the non-display area NDA, and the display area DA may include the second area A2 adjacent to the first area A1 with a certain interval therebetween. At this time, the first dam 242 may surround the second area A2. The laser-cutting operation may cut the thin-film transistor unit 200 and the flexible substrate 100 along the first area A1 by irradiating a first laser beam L1. The second area A2 is therefore between a surface cut by the laser-cutting operation and the first dam 242.

The laser-cutting operation for the flexible substrate 100 and the thin-film transistor unit 200 may include formation of a first penetrating portion 100a in the flexible substrate 100 and formation of a second penetrating portion 200a in the thin-film transistor unit 200. According to the present embodiment, the laser beam L1 is irradiated in a direction from the thin-film transistor unit 200. As a result, the first penetrating portion 100a is formed in the flexible substrate 100 after the second penetrating portion 200a is formed in the thin-film transistor unit 200. In one embodiment, when the laser beam L1 is irradiated in a direction from the supporting substrate 10, the second penetrating portion 200a may be formed in the thin-film transistor unit 200 after the first penetrating portion 100a is formed in the flexible substrate 100.

According to the present embodiment, the first penetrating portion 100a and the second penetrating portion 200a may have a same inner surface. This is because the first penetrating portion 100a and the second penetrating portion 200a may be formed in a same laser-cutting operation, for example, as described above.

A dummy portion DM may be on the first area A1 with the laser-cut portions as a boundary. The dummy portion DM may include at least a portion of the flexible substrate 100 and at least a portion of the thin-film transistor unit 200. According to the present embodiment, the first area A1 and the second area A2 are circular areas and the dummy portion DM is also formed to have a circular shape. In another embodiment, the first area A1 and the second area A2 may have various other or different shapes.

Figure 3A:
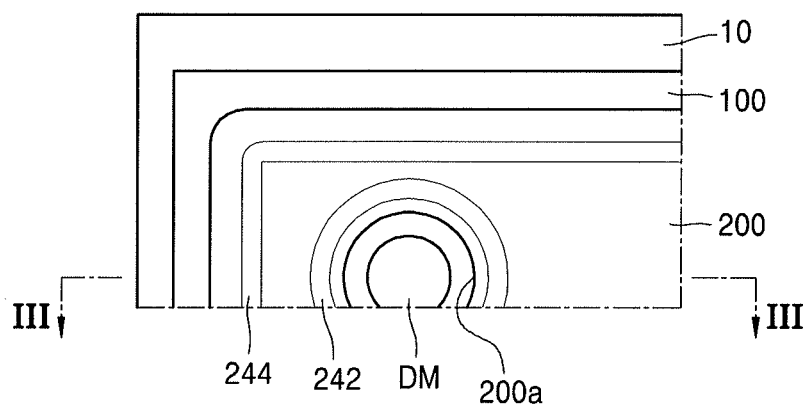
FIGS. 3A and 3B illustrate another operation in the embodiment of a process for manufacturing a display apparatus.
Figure 3B:
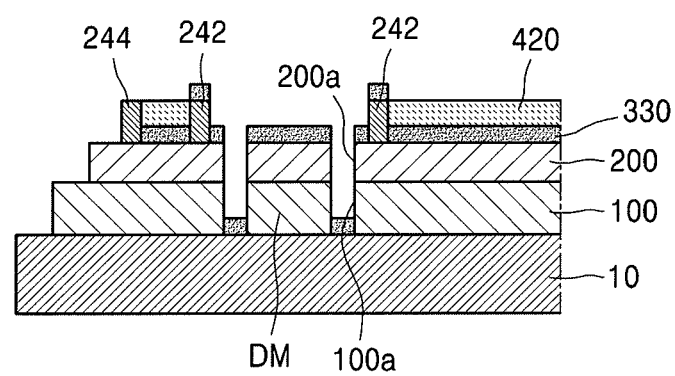

FIGS. 3A and 3B illustrate plan and cross-sectional views of an additional operation of the embodiment of a process for manufacturing a display apparatus.

Referring to FIGS. 3A and 3B, the additional operation may include disposing a light-emitting unit 300 and an encapsulator 400 on the thin-film transistor unit 200. The light-emitting unit 300 may include a pixel electrode 310, an intermediate layer including an emission layer 320, and a counter electrode 330. FIGS. 3A and 3B show that only the counter electrode 330 and the pixel electrode 310 are disposed on the thin-film transistor unit 200 before the counter electrode 330 is disposed. Also, a pixel defining film 240 may be disposed to define a light-emitting unit by covering the edges of the pixel electrode 310 and exposing the center portion of the pixel electrode 310. The emission layer 320 may then be disposed on the pixel electrode 310 (e.g., see FIG. 9). The counter electrode 330 may be disposed on the front surface of the thin-film transistor unit 200 to cover the emission layer 320. Thus, in one embodiment, the counter electrode 330 may be integrally disposed on the thin-film transistor unit 200, unlike the pixel electrode 310, which is patterned for each pixel.

According to the present embodiment, at least a portion of the counter electrode 330 may be disposed on the first dam 242. FIGS. 3A and 3B show that a portion of the counter electrode 330 is located only on the first dam 242. In one embodiment, at least a portion of the counter electrode 330 may also be located on the second dam 244.

After the counter electrode 330 is disposed, the encapsulator 400 may be disposed on the counter electrode 330. The encapsulator 400 may include the organic encapsulation layer 420 shown in FIG. 3B. Referring to FIG. 9, the encapsulator 400 may be disposed, for example, by sequentially stacking a first inorganic encapsulation layer 410, the organic encapsulation layer 420, and a second inorganic encapsulation layer 430.

According to the present embodiment, the organic encapsulation layer 420 may be disposed between first dam 242 and second dam 244. The organic encapsulation layer 420 is between the first dam 242 and the second dam 244, because the organic encapsulation layer 420 is prevented from flowing to the outside by the first dam 242 and the second dam 244. For example, the first dam 242 and the second dam 244 serve as partitioning walls to locate the organic encapsulation layer 420 between the first dam 242 and the second dam 244.

At least a portion of the counter electrode 330 may be on the dummy portion DM in the first area A1. At least a portion of the counter electrode 330 may also be on a portion of the supporting substrate 10 exposed by the first penetrating portion 100a and the second penetrating portion 200a. This is because the counter electrode 330 is disposed on the front surface of the thin-film transistor unit 200, as described above.

Figure 4A:
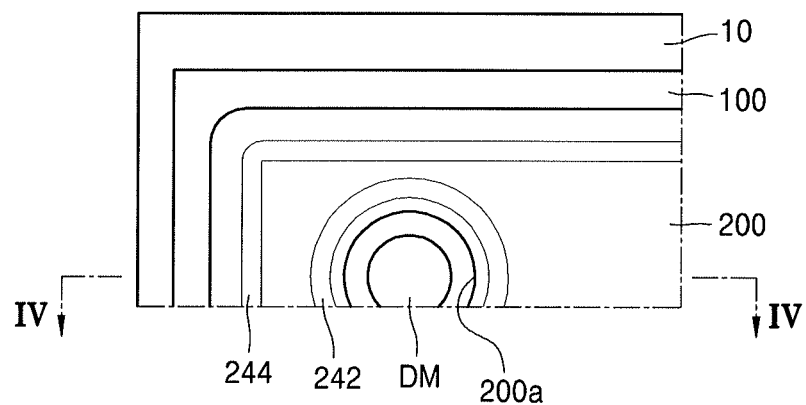
FIGS. 4A and 4B illustrate another operation in the embodiment of a process for manufacturing a display apparatus.
Figure 4B:
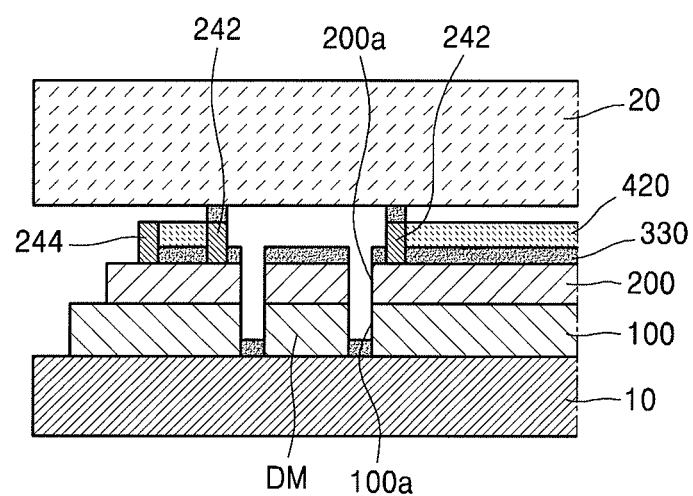

FIGS. 4A and 4B illustrate plan and cross-sectional views of an additional operation of the embodiment of a process for manufacturing a display apparatus.

Referring to FIGS. 4A and 4B, the additional operation includes attaching a top film 20 to the top of the encapsulator 400. The top film 20 may be attached to protect the flexible substrate 100 and features on the flexible substrate 100 during the manufacturing process. FIG. 4B shows that the top film 20 is attached to contact the counter electrode 330 on the first dam 242. In one embodiment, the encapsulator 400 may be disposed on the counter electrode 330 and at least portions of the first inorganic encapsulation layer 410 and the second inorganic encapsulation layer 430 may be located on the counter electrode 330. Therefore, the top film 20 may substantially contact the second inorganic encapsulation layer 430.

A separate functional layer may be disposed on the second inorganic encapsulation layer 430. The top film 20 may substantially contact the functional layer.

Figure 5A:
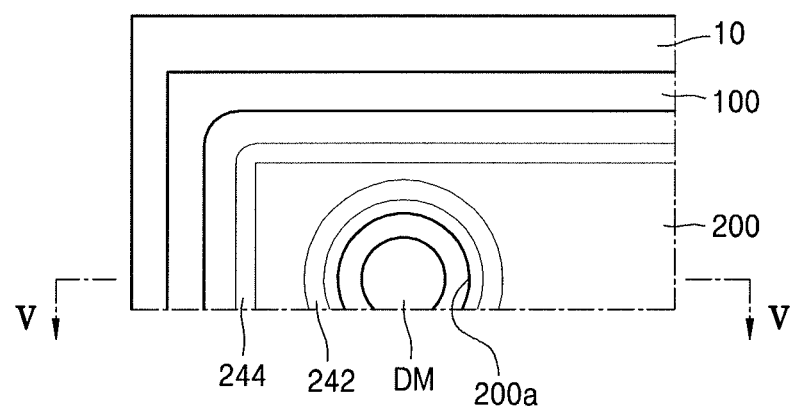
FIGS. 5A and 5B illustrate another operation in the embodiment of a process for manufacturing a display apparatus.
Figure 5B:
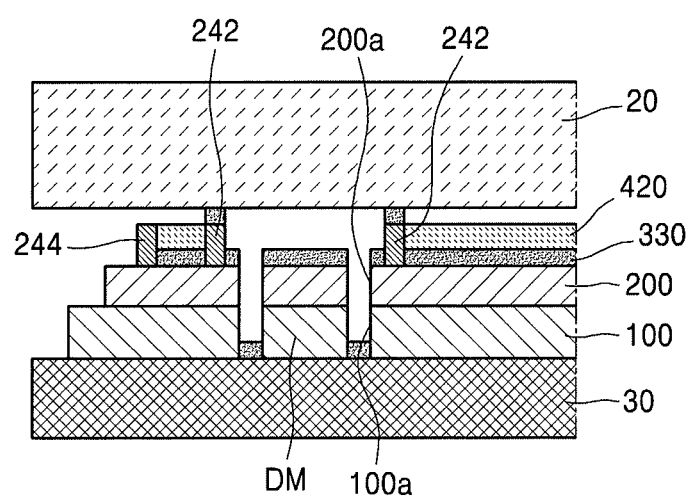

FIGS. 5A and 5B illustrate plan and cross-sectional views of an additional operation of the embodiment of a process for manufacturing a display apparatus.

Referring to FIGS. 5A and 5B, after the flexible substrate 100 is separated from the supporting substrate 10, the additional operation includes attaching a bottom film 30 to the bottom surface of the flexible substrate 100. The bottom film 30 may be a film that is temporarily attached for a cell-cutting process (to be described later) and may include a plastic material, such as but not limited to polyethylene naphthalate (PEN) and polyethyeleneterephthalate (PET).

Separation of the flexible substrate 100 from the supporting substrate 10 may be performed using various methods used in semiconductor manufacturing. A sacrificing layer may be further interposed between the supporting substrate 10 and the flexible substrate 100. Depending on the characteristics of the sacrificing layer, a method of irradiating a laser beam for separation or dissolving the sacrificing layer using the moisture or a solvent may be used.

Figure 6A:
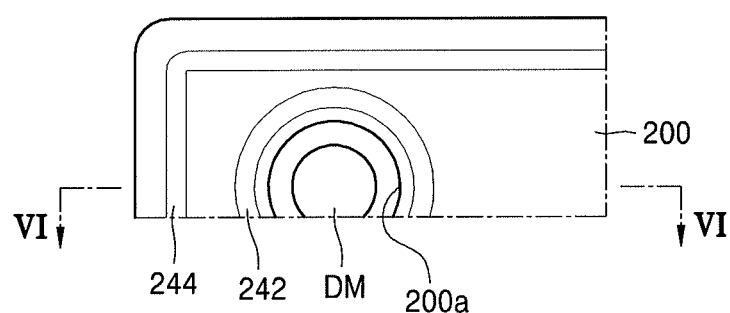
FIGS. 6A and 6B illustrate another operation in the embodiment of a process for manufacturing a display apparatus.
Figure 6B:
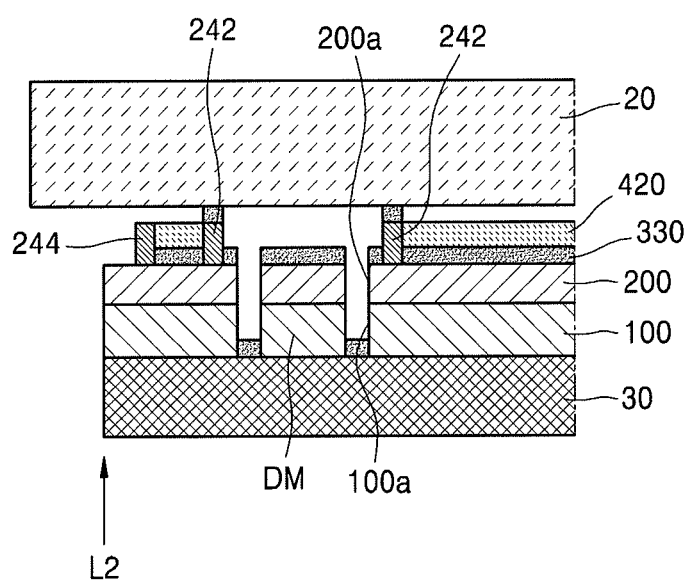

FIGS. 6A and 6B illustrates plan and cross-sectional views of an additional operation of the embodiment of a process for manufacturing a display apparatus.

Referring to FIGS. 6A and 6B, additional operation is a cell-cutting operation for the bottom film 30 and the flexible substrate 100. The cell-cutting operation may be performed, for example, by irradiating a laser beam L2 along a cutting line. Through the cell-cutting operation, the bottom film 30, the flexible substrate 100, and at least a portion of the thin-film transistor unit 200 on the flexible substrate 100 may be cut.

In order to prevent damage to the thin-film transistor unit 200 on the flexible substrate 100 during the cell-cutting operation, a cell-cutting line may optionally be formed without the organic encapsulation film 220 of the thin-film transistor unit 200.

Figure 7A:
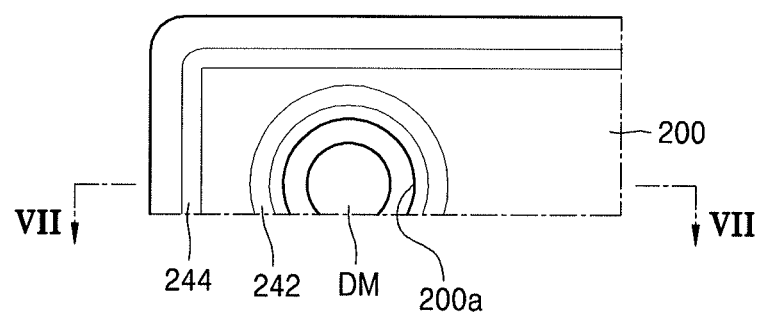
FIGS. 7A and 7B illustrate another operation in the embodiment of a process for manufacturing a display apparatus.
Figure 7B:
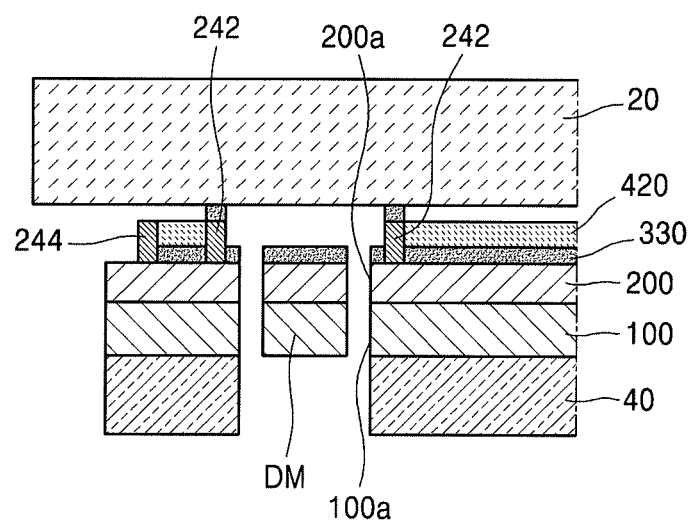

FIGS. 7A and 7B illustrate plan and cross-sectional views of another operation of the embodiment of a process for manufacturing a display apparatus.

Referring to FIGS. 7A and 7B, after the bottom film 30 is removed from the flexible substrate 100, the additional operation includes attaching a protective film 40 to the bottom surface of the flexible substrate 100. When the bottom film 30 is removed from the flexible substrate 100, the dummy portion DM in the first area A1 may be removed together with the bottom film 30. Therefore, a penetrating hole H may be formed in the first area A1 of the flexible substrate 100. The penetrating hole H is in the display area DA and, for example, may be used for various applications by mounting a camera therein in a subsequent process or by being combined with other parts.

The protection film 40 protects the bottom surface of the flexible substrate 100 having flexible characteristics. The durability of the flexible substrate 100 may be improved by attaching the protection film 40 to the bottom surface. The protective film 40 may be provided with an adhesive layer. The protective film 40 may be attached to the flexible substrate 100 via the adhesive layer. Examples of materials for the protection film 40 include a polymer resin, such as polyethersulphone (PES), polyacrylate (PAR), polyetherimide (PEI), polyethyelenen napthalate (PEN), polyethyeleneterephthalate (PET), polyphenylene sulfide (PPS), polyallylate, polyimide (PI), polycarbonate (PC), and cellulose acetate propionate (CAP).

Figure 8A:
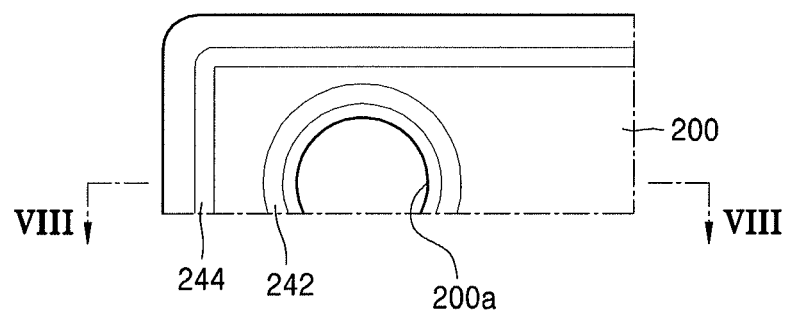
FIGS. 8A and 8B illustrate another operation in the embodiment of a process for manufacturing a display apparatus.
Figure 8B:
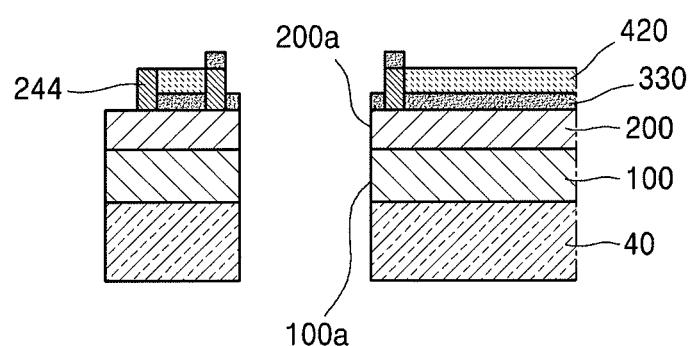

FIGS. 8A and 8B illustrate plan and cross-sectional views of an additional operation of the process for manufacturing a display apparatus according to an example embodiment.

Referring to FIGS. 8A and 8B, the additional operation includes removing the top film 20. Therefore, a module for a display apparatus may be manufactured in which the bottom film 30, the flexible substrate 100, the thin-film transistor unit 200, the light-emitting unit 300, and the encapsulator 400 are sequentially stacked.

FIG. 9 illustrates a cross-sectional view of an embodiment of the display area DA of a display apparatus. Referring to FIG. 9, the thin-film transistor 210 includes a semiconductor layer 211 including amorphous silicon, polycrystalline silicon, or an organic semiconductor material, a gate electrode 213, a source electrode 215*a*, and a drain electrode 215*b*.

A gate insulation film 226 including an inorganic material (e.g., silicon oxide, silicon nitride, and/or silicon oxynitride) may be between the semiconductor layer 211 and the gate electrode 213 to secure insulation between the semiconductor layer 211 and the gate electrode 213. An interlayer insulation film 228 including an inorganic material (e.g., silicon oxide, silicon nitride, and/or silicon oxynitride) may be on the gate electrode 213. The source electrode 215*a* and the drain electrode 215*b* may be on the interlayer insulation film 228. Such an insulating film including an inorganic material may be disposed, for example, by chemical vapor deposition (CVD) or atomic layer deposition (ALD). The same also applies to embodiments described below and modifications thereof.

A barrier layer 222 and a buffer layer 224 including an inorganic material (e.g., silicon oxide, silicon nitride, and/or silicon oxynitride) may be between the thin-film transistor 210 and the substrate 100 having a structure as described above. The barrier layer 222 and the buffer layer 224 may planarize the top surface of the substrate 100 and/or may prevent impurities from the flexible substrate 100 from permeating into the semiconductor layer 211 of the thin-film transistor 210.

A planarizing layer 230 may be on the thin-film transistor 210. For example, when an organic light-emitting diode is on the thin-film transistor 210 as shown in FIG. 9, the planarizing layer 230 may substantially planarize the top of the passivation layer covering the thin-film transistor 210. The planarizing layer 230 may include, for example, an organic material, e.g., acryl, benzocyclobutene (BCB), or hexamethyldisiloxane (HMDSO). The planarizing layer 230 is shown as a single layer in FIG. 2, but the planarizing layer 230 may be multilayered in another embodiment.

An intermediate layer may be on the planarizing layer 230 in the display area DA of the substrate 100. The intermediate layer may include the pixel electrode 310, the counter electrode 330, and the emission layer 320 therebetween. The pixel electrode 310 is electrically connected to the thin-film transistor 210, through the source electrode 215*a* or the drain electrode 215*b*, through an opening in the planarizing layer 230 as shown in FIG. 9.

The pixel defining film 240 may be on the planarizing layer 230 to define a pixel by having openings corresponding to respective sub-pixels, that is, an opening that exposes at least the center portion of the pixel electrode 310. Furthermore, as shown in FIG. 9, the pixel defining film 240 increases the distance between the edge of the pixel electrode 310 and the counter electrode 330 above the pixel electrode 310, thereby preventing occurrence of an arc or the like at an edge of the pixel electrode 310. The pixel defining film 240 may include, for example, an organic material, e.g., polyimide or hexamethyldisiloxane (HMDSO).

The intermediate layer of the organic light-emitting device may include a monomer or polymer material. When a monomer material is included, the intermediate layer may have a single-layer structure or a composite structure in which a hole injection layer (HIL), a hole transport layer (HTL), the emission layer (EML) 320, an electron transport layer (ETL), and/or an electron injection layer (EIL) are stacked. The intermediate layer may include various organic materials, e.g., copper phthalocyanine (CuPc), N,N'-Di (naphthalen-1-yl) (NPB), and tris-8-hydroxyquinoline aluminum (Alq3). These layers may be arranged using, for example, a vacuum deposition method.

When the intermediate layer includes a polymer material, the intermediate layer may have a structure including a HTL and the EML 320. In one embodiment, the hole transport layer may include PEDOT, and the emission layer 320 may include a polymer material such as poly-phenylenevinylene (PPV) and polyfluorene. Such an intermediate layer may be arranged using a screen printing method, an inkjet printing method, a laser induced thermal imaging (LITI) method, or another method.

The intermediate layer may have a different structure and/or different materials in another embodiment. Furthermore, the intermediate layer may include a single layer over a plurality of pixel electrodes 310 or may include layers patterned to respectively correspond to the plurality of pixel electrodes 310.

The counter electrode 330 is on and may cover the display area DA, as shown in FIG. 9. In one embodiment, the counter electrode 330 may be integrally disposed as a single component with respect to a plurality of organic light-emitting devices and may correspond to the plurality of pixel electrodes 310.

The organic light-emitting device may be easily damaged by moisture or oxygen from the outside. The encapsulator 400 may cover and protect the organic light-emitting device from the moisture and oxygen. The encapsulator 400 covers the display area DA and may extend to the outside the display area DA. The encapsulator 400 may include the first inorganic encapsulation layer 410, the organic encapsulation layer 420, and the second inorganic encapsulation layer 430 as shown in FIG. 9.

The first inorganic encapsulation layer 410 covers the counter electrode 330 and may include, for example, silicon oxide, silicon nitride, and/or silicon oxynitride. One or more optional layers (e.g., a capping layer) may be between the first inorganic encapsulation layer 410 and the counter electrode 330.

Since the first inorganic encapsulation layer 410 is along the underlying structure, the top surface of the first inorganic encapsulation layer 410 may not be flat as shown in FIG. 9. The organic encapsulation layer 420 covers the first inorganic encapsulation layer 410. Unlike the first inorganic encapsulation layer 410, the organic encapsulation layer 420 may have a substantially flat top surface. For example, the organic encapsulation layer 420 may have a substantially flat top surface at a portion corresponding to the display area DA. The organic encapsulation layer 420 may include one or more materials including but not limited to polyethylene terephthalate, polyethylene naphthalate, polycarbonate, polyimide, polyethylene sulfonate, polyoxymethylene, polyarylate, and/or hexamethyldisiloxane.

The second inorganic encapsulation layer 430 covers the organic encapsulation layer 420 and, for example, may include silicon oxide, silicon nitride, and/or silicon oxynitride. The second inorganic encapsulation layer 430 may contact the first inorganic encapsulation layer 410 at an edge of second inorganic encapsulation layer 430 outside the display area DA, thereby preventing the organic encapsulation layer 420 from being exposed to the outside.

As previously described, because the encapsulator 400 includes the first inorganic encapsulation layer 410, the organic encapsulation layer 420, and the second inorganic encapsulation layer 430, the multilayered structure may prevent any cracks that form in the encapsulator 400 from being connected to one another between the first inorganic encapsulation layer 410 and the organic encapsulation layer 420 or between the organic encapsulation layer 420 and the second inorganic encapsulation layer 430. As a result, formation of a path through which moisture or oxygen from the outside penetrates into the display area DA may be prevented, reduced, or minimized.

A polarizing plate may be disposed on the encapsulator 400, for example, by an optically clear adhesive (OCA). The polarizing plate may reduce reflection of external light. For example, when external light passes through the polarizing plate, reflects from the top surface of the counter electrode 330, and passes through the polarizing plate again, the phase of the external light may be changed as a result of passing through the polarizer twice. Because the phase of the reflected light is different from the phase of the external light incident to the polarizing plate, destructive interference occurs. Therefore, visibility may be improved as external light reflection is reduced. According to another example embodiment, a black matrix and a color filter without a polarizing plate may be used to reduce reflection of external light in the display apparatus.

Touch electrodes may arranged in various patterns on the encapsulator 400 in order to provide a touch screen function.

The inorganic material, the buffer layer 224, the gate insulation film 226, and the interlayer insulation film 228 of the barrier layer 222 may be collectively referred to as an inorganic insulator 110. The inorganic insulator 110 may extend from the display area DA toward the non-display area NDA to the edge of the flexible substrate 100, as shown in FIG. 9.

Figure 10:
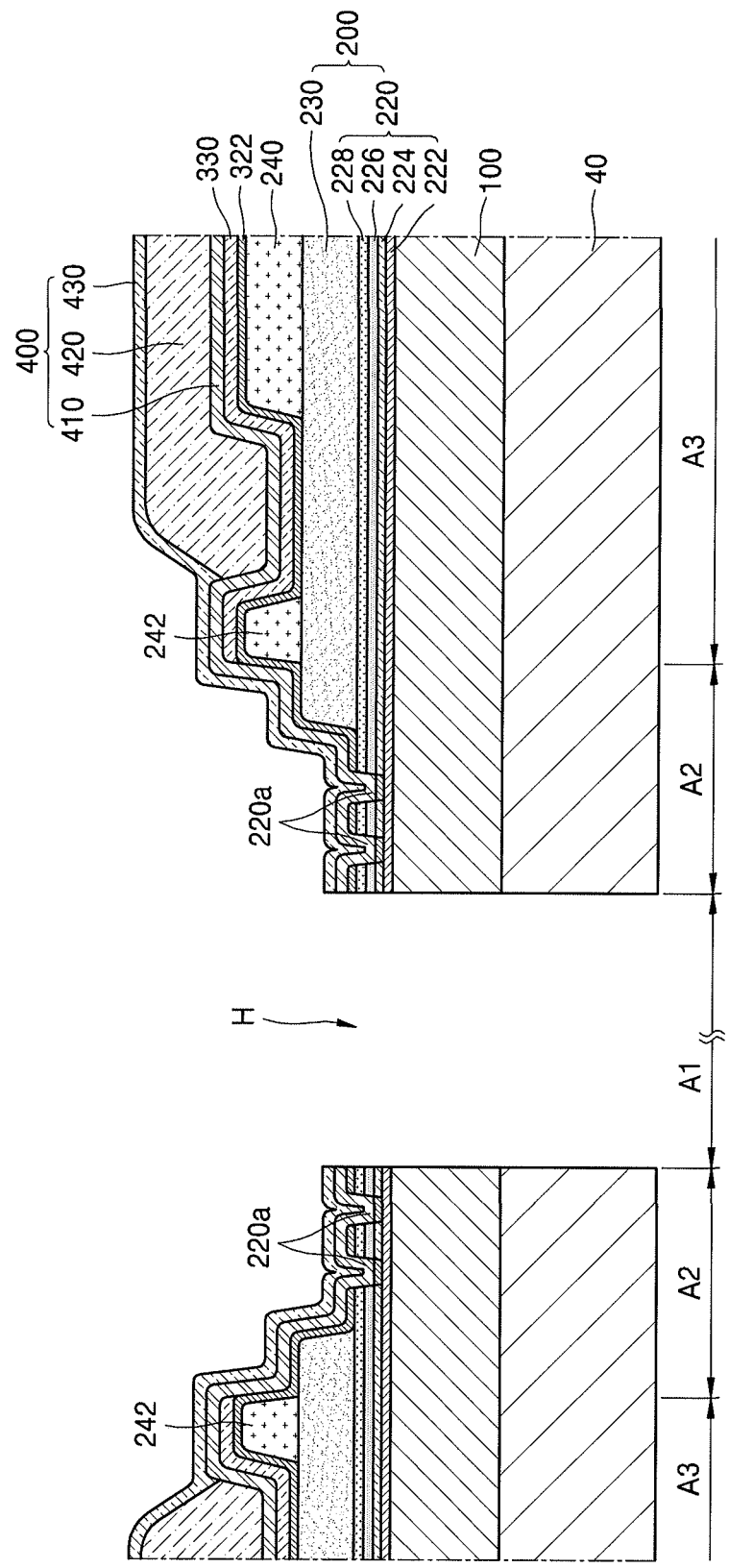
FIG. 10 illustrates an embodiment of a portion of a display apparatus adjacent to a penetrating hole.

FIG. 10 illustrates a cross-sectional view of a portion of a display apparatus around the penetrating hole H according to an example embodiment.

Referring to FIG. 10, at least one fine hole 220*a* may be formed in the organic encapsulation film 220 in the second area A2 of the flexible substrate 100. As described above, the intermediate layer of the light-emitting unit 300 may include the EML 320 and, in some cases, common layers 322. Unlike the EML 320, the common layers 322 may be on the front surface of the flexible substrate 100. Therefore, the organic encapsulation film 220 on the second area A2 may have the at least one fine hole 220*a* to prevent the common layer 322 from continuing to the edge where the penetrating hole H is located.

The counter electrode 330 may be on the flexible substrate 100 on the common layer 322, and the first inorganic encapsulation layer 410 and the second inorganic encapsulation layer 430 may be on the counter electrode 330. The first inorganic encapsulation layer 410 and the second inorganic encapsulation layer 430 may extend to the edge of the penetrating hole H. In this case, the first inorganic encapsulation layer 410 and the second inorganic encapsulation layer 430 may prevent moisture or oxygen from permeating into the display area DA from the outside. The first inorganic encapsulation layer 410 and the second inorganic encapsulation layer 430 may cover the fine hole 220a and be continuous. In one embodiment, the size of the fine hole 220a may be less than twice the thickness of the first inorganic encapsulation layer 410 or the second inorganic encapsulation layer 430.

Due to the structure of the fine hole 220a, the common layer 322 may be discontinuous in the second area A2, whereas the first inorganic encapsulation layer 410 and the second inorganic encapsulation layer 430 may be continuously disposed.

In accordance with one or more of the aforementioned embodiments, a display apparatus may have a penetrating hole H in a display area DA. In order to form such the penetrating hole H, a two-stage laser-cutting technique may be used. The penetrating hole H may be formed in the display area DA using a fine metal mask (FMM) of a type used for manufacturing a display apparatus, e.g., without using a specialized fine metal mask. As a result, manufacturing costs may be reduced. Therefore, a design that is difficult to be manufacture using a FMM or a design like the penetrating hole H may be freely manufactured.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display apparatus, comprising:
 a flexible substrate including a display area, a penetrating hole area, and a peripheral area adjacent to the penetrating hole area, and a first penetrating portion corresponding to the penetrating hole area;
 a thin-film transistor unit in the display area and at least a portion of the peripheral area, the thin-film transistor unit including a thin-film transistor and an insulation layer and having a second penetrating portion corresponding to the penetrating hole area;
 a light-emitting unit on the thin-film transistor unit and including a pixel electrode, an intermediate layer, and a counter electrode; and
 at least one hole in the peripheral area, the at least one hole surrounding the penetrating hole area,
 wherein at least a portion of the intermediate layer is disposed in the at least one hole.

2. The display apparatus as claimed in claim 1, wherein the at least one hole has a shape in which at least part of the insulation layer is recessed.

3. The display apparatus as claimed in claim 1, wherein the thin-film transistor unit comprises a buffer layer including an inorganic material in the display area, a semiconductor layer on the buffer layer, a gate insulation film on the semiconductor layer, a gate electrode overlapping at least a part of the semiconductor layer and disposed on the gate insulation film, an interlayer insulation film on the gate electrode, and an electrode layer connected to the semiconductor layer through a contact hole and disposed on the interlayer insulation film, and
 the at least one hole penetrates at least a portion of the buffer layer, the gate insulation film, and the interlayer insulation film.

4. The display apparatus as claimed in claim 3, wherein the at least on hole extends below the gate insulation film.

5. The display apparatus as claimed in claim 3, wherein
 the at least one hole includes at least two holes, and
 at least a portion of the intermediate layer is disposed over a structure formed by the at least two holes.

6. The display apparatus as claimed in claim 5, wherein the structure has a configuration where at least some of the buffer layer, the gate insulation film, and the interlayer insulation film.

7. The display apparatus as claimed in claim 5, further comprising an encapsulation layer over the display area, wherein
 the encapsulation layer includes an organic encapsulation layer disposed between a first inorganic encapsulation layer and a second inorganic encapsulation layer, and
 at least a portion of the first inorganic encapsulation layer is disposed in the at least one hole.

8. The display apparatus as claimed in claim 7, wherein at least a portion of the first inorganic encapsulation layer disposed on the intermediate layer is disposed over the structure.

9. The display apparatus as claimed in claim 8, wherein at least a portion of the second inorganic encapsulation layer disposed on the intermediate layer is disposed over the structure.

10. The display apparatus as claimed in claim 5, wherein the intermediate layer is discontinuous between the structure and the at least two holes.

11. The display apparatus as claimed in claim 5, wherein
 the intermediate layer is disposed on a top surface of the structure, and
 the intermediate layer is partially disposed on a side surface of the structure.

12. The display apparatus as claimed in claim 7, further comprising:
 a planarizing layer disposed over the electrode layer; and
 a first dam disposed on the planarizing layer and surrounding the penetrating hole area.

13. The display apparatus as claimed in claim 12, further comprising:
 a pixel defining film that defines a pixel area by exposing a center portion of the pixel electrode and covering an edge of the pixel electrode,
 wherein the pixel defining film and the first dam include a same material.

14. The display apparatus as claimed in claim 12, wherein the first dam is spaced apart from the penetrating hole area by a predetermined distance.

15. The display apparatus as claimed in claim 12, further comprising a second dam in the peripheral area.

16. The display apparatus as claimed in claim 15, wherein the organic encapsulation layer is disposed between the first dam and the second dam.

17. The display apparatus as claimed in claim 12, wherein at least a portion of the counter electrode is disposed on the first dam.

18. The display apparatus as claim in claim 12, wherein in a plan view, the at least one hole is disposed on the inner side of the first dam, and the penetrating hole area is disposed on the inner side of the at least one hole.

19. The display apparatus as claimed in claim 1, wherein the first penetrating portion and the second penetrating portion have a same inner surface.

20. The display apparatus as claimed in claim 1, wherein the first penetrating portion and the second penetrating portion comprise a penetrating hole.

\* \* \* \* \*